(12) United States Patent
Ando

(10) Patent No.: US 7,049,993 B2
(45) Date of Patent: May 23, 2006

(54) ANALOG-TO-DIGITAL CONVERTER AND MICROCOMPUTER IN WHICH THE SAME IS INSTALLED

(75) Inventor: Kazumasa Ando, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 3 days.

(21) Appl. No.: 11/037,103

(22) Filed: Jan. 19, 2005

(65) Prior Publication Data
US 2005/0184894 A1     Aug. 25, 2005

(30) Foreign Application Priority Data
Jan. 20, 2004     (JP)     ............................ P2004-011810

(51) Int. Cl.
*H03M 1/12*     (2006.01)
(52) U.S. Cl. ....................... 341/155; 341/156
(58) Field of Classification Search ...................... None
See application file for complete search history.

(56) References Cited

U.S. PATENT DOCUMENTS 5,619,201 A     4/1997     Imakura
5,677,692 A *   10/1997    Hasegawa ................... 341/161
5,877,719 A     3/1999     Matsui et al.
6,094,154 A *   7/2000     Lee ............................ 341/161

* cited by examiner

*Primary Examiner*—Peguy JeanPierre
*Assistant Examiner*—Joseph Lauture
(74) *Attorney, Agent, or Firm*—Oblon, Spivak, McClelland, Maier & Neustadt, P.C.

(57) ABSTRACT

An A/D converter 11 is provided with analog input terminals 12, input terminal selection circuit 13, preset registers 15, preset data registers 16, preset data selection circuit 17, and sampling capacitor C. Input terminal selection circuit 13 selects one of analog input terminals 12. Preset registers 15 are correspondingly provided for analog input terminals 12. Preset data selection circuit 17 selects preset digital data which preset data registers 16 stores. Preset data stored at preset registers 15 corresponding to input terminals 12 designated by input terminal selection circuit 13 are converted into analog signals as pre-charge voltages. One of the preset data is selected for each analog input terminal 12 in response to kinds of the input voltages. It is supplied to sampling capacitor C as a pre-charge voltage for a sampling duration of a sampling period for the A/D conversion.

6 Claims, 5 Drawing Sheets

ANALOG-TO-DIGITAL CONVERTER AND MICROCOMPUTER IN WHICH THE SAME IS INSTALLED

CROSS-REFERENSE TO RELATED APPLICATION

This application is based upon and claims the benefit of priority from the prior Japanese Patent Application No. 2004-011810, filed on Jan. 20, 2004, the entire contents of which are incorporated in this application by reference.

FIELD OF THE INVENTION

This invention generally relates to an analog-to-digital converter to convert analog data obtained from the measurement of objects to digital data and, in particular, to an analog-to-digital converter provided with a function for pre-charging a sampling capacitor prior to voltage-sampling operations and a microcomputer in which such an analog-to-digital converter is installed.

RELATED ART

An analog-to-digital (A/D) converter includes a sampling capacitor which holds electrical charges at the time when the A/D converter performs an A/D conversion even after the A/D conversion.

When the next A/D conversion is carried out, if there are big differences between voltages held with the sampling capacitor and those that are currently being inputted for the A/D conversion, charging and discharging the capacitor with electrical charges are not sufficiently conducted during the sampling period so that results of the A/D conversion may give rise to errors. In addition, if the currently inputted voltages are lower than those held by the sampling capacitor, electrical charges flow back to the input side and result in excessive electrical currents so that they may possibly damage associated circuits.

Thus, conventional A/D converters require sufficiently long sampling periods. However, such long sampling periods cause disadvantages in long sampling operations.

Contrary to it, a conventional, well known A/D converter charges a sampling capacitor with a predetermined value of voltage so as to charge and discharge the capacitor during short sampling periods as described in Japanese Unexamined Patent Publication (Tokkaihei) No. 10-261962 (see particularly descriptions on page 4 and FIG. 1).

Such a conventional A/D converter will be set forth below. FIG. 7 shows a block diagram of its structure.

As shown, A/D converter 100 is composed of multiplexer 101, sample-hold circuit 102, comparison circuit 103, D/A converter 104 and A/D conversion-result storage registers 105.

During a pre-charge period of time indicated by sampling start signal "a", sample-hold circuit 102 charges its internal sampling capacitor with pre-charge voltages "b" provided by D/A converter 104.

During a sampling period of time indicated by sampling start signal "a", however, voltages at analog input terminals selected by multiplexer 101 are charged by the sampling capacitor for sampling and holding.

Comparator 103 compares the voltages sampled and held by sample-hold circuit 102 with comparison voltage "c" provided by D/A converter 104 and provides digital control signals "d" to D/A converter 104 to make differences between the sampled and held voltages and comparison voltage "c" small.

When an output of sample-hold circuit 102 is substantially equal to comparison voltage "c", a digital value finally derived from D/A converter 104 is supplied as conversion-result signal "e" to A/D conversion-result storage register 105.

Further, comparison circuit 103 provides sample-hold circuit 102 with sampling start signal "a" and D/A converter 104 with control signal "d" indicating the pre-charge period.

D/A converter 104 converts previous conversion result "f" into pre-charge voltage "b" and supplies the same to sample-hold circuit 102 during the period that voltage control signal "d" indicates the pre-charge. D/A converter 104 also converts a digital value of voltage control signal "d" into comparison voltage "c" during the period that voltage control signal "d" indicates other than the pre-charge.

A/D conversion-result storage register 105 outputs a conversion-result, as previous conversion-result "f", stored at an address corresponding to a terminal selected by multiplexer 101 and stores new conversion-result "e" at an address corresponding to an input terminal selected by multiplexer 101 upon receipt of such new conversion-result "e".

The prior art A/D converter shown in Japanese Unexamined Patent Publication (Tokkaihei) No. 10-261962 uses previous conversion-result "f" as pre-charge voltage "b" on the assumption that the previous conversion-result is close in magnitude to the present conversion-result with a high probability because change speeds of analog input voltages are slow in comparison with processing speeds of A/D converter 100.

Thus, pre-charge voltages "b" cannot be changed to other values than previous-conversion result "f" in response to various kinds of input voltages.

In other words, sufficient conversion accuracy is not always achieved for some kinds of input voltages in the cases that a voltage of previous conversion-result "f" is only applied to charge a sampling capacitor in advance.

More particularly, such cases are, for example, that the same A/D converter is used for both ordinary A/D conversions of input voltages derived from high impedance sensors and high-speed A/D conversions of input voltages derived from low impedance sensors.

Since a sampling period is set to be short for high-speed input voltages, pre-charge voltages need to be selected so that sufficient charge and discharge of voltages can be carried out for a sampling capacitor during the short sampling period.

SUMMARY OF THE INVENTION

Accordingly, the present invention provides an A/D converter to pre-charge a sampling capacitor selectively with voltages in response to kinds of input voltages for respective input terminals and a micro-computer in which the same is installed.

An embodiment of the present invention is directed to an analog-to-digital converter provided with analog input terminals to which analog input signals are supplied, an input terminal selection circuit to select one of the analog input terminals, preset registers provided for the analog input terminals, preset data registers to store preset data, a preset data selection circuit to select and provide one of the preset data to the preset registers, a preset register selection circuit to select one of the preset registers which corresponds to the one of the analog input terminals selected by the input terminal selection circuit, a digital-to-analog (D/A) conversion circuit to convert an output of the preset data registers into an analog voltage, a sampling capacitor and an A/D conversion circuit which provides the sampling capacitor with an output of said digital-to-analog conversion circuit for a pre-charge duration of a sampling period and the input voltage at the one of the analog input terminals selected by the input terminal selection circuit for a sampling duration of the sampling period and which compares a voltage of said sampling capacitor with a predetermined reference voltage to convert the input voltage into digital data for a conversion duration, wherein the A/D converter selects the preset data in response to kinds of the input voltages applied for the input terminals.

BRIEF DESCRIPTION OF THE DRAWINGS

A more complete appreciation of the present invention and many of its attendant advantages will be readily obtained as the same becomes better understood by reference to the following detailed descriptions when considered in connection with the accompanying drawings, wherein.

DESCRIPTION OF THE EMBODIMENTS

Figure 1:
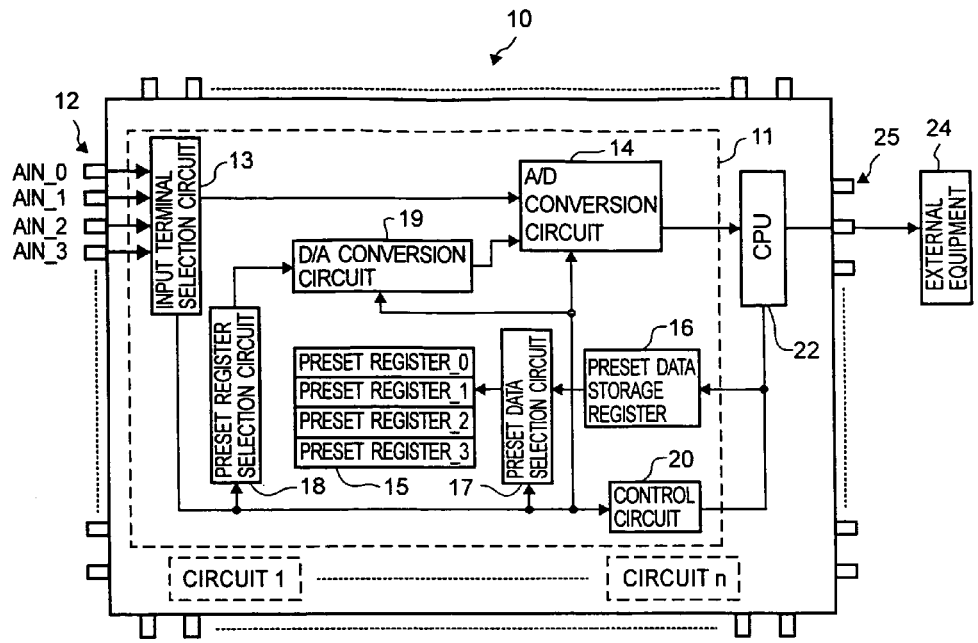
FIG. 1 is a block diagram of a micro-computer in which an A/D converter is installed according to an embodiment of the present invention.

Embodiments of the present invention will be explained below with reference to the attached drawings. It should be noted that the present invention is not limited to the embodiments but covers their equivalents. Throughout the attached drawings, similar or same reference numerals show similar, equivalent or same components.

FIG. 1 is a block diagram of a micro-computer in which an A/D converter is installed according to an embodiment of the present invention.

As shown in FIG. 1, micro-computer 10 includes A/D converter 11 provided with input terminal selection circuit 13 and A/D conversion circuit 14. Input terminal selection circuit 13 selects one of analog input terminals 12, an input signal of which is supplied to A/D conversion circuit 14 for A/D conversion.

Micro-computer 10 further includes preset registers 15, preset data storage register 16, preset data selection circuit 17, preset register selection circuit 18, D/A conversion circuit 19 and control circuit 20. The number of preset registers 15 is equal to that of analog input terminals 12. Preset data storage register 16 stores a plurality of preset data while preset data selection circuit 17 selects one of such preset data and stores it at preset registers 15. Preset register selection circuit 18 selects one of preset registers 15 corresponding to that of analog input terminals 12 selected by input terminal selection circuit 13. D/A conversion circuit 19 converts digital outputs from preset register selection circuit 18 into analog voltages. Control circuit 20 controls operation timings of A/D converter 11.

In addition, micro-computer 10 also includes CPU 22 to carry out a predetermined process in response to A/D conversion results of A/D conversion circuit 14 and output terminals 25 through which processing results of CPU 22 are transmitted to external equipment 24.

Preset data storage register 16 has a plurality of registers which store preset data in accordance with kinds of input voltages, such as a predetermined fixed value, A/D conversion results at previous sampling periods and estimated data from a past record of the A/D conversion results.

Preset data selection circuit 17 selects one of the preset data in response to a kind of an input voltage at an input terminal selected by input terminal selection circuit 13 and stores it at one of preset registers 15 corresponding to the input terminal selected by input terminal selection circuit 13.

Preset registers 15 has registers which correspond to input terminals 12 and which store preset data in accordance with respective kinds of input voltages at input terminals 12.

Preset register selection circuit 18 provides D/A conversion circuit 19, so that it is pre-charged with preset data stored at preset register 15 corresponding to input terminal 12 designated by input terminal selection circuit 13.

Control circuit 20 sends selection instructions to input terminal selection circuit 13, preset data selection circuit 17 and preset register 18 in response to an instruction of CPU 22. Also, control circuit 20 supplies conversion start instructions to D/A conversion circuit 19 and A/D conversion circuit 14, respectively.

A/D conversion circuit 14 includes a sampling capacitor which is pre-charged with output voltages of D/A conversion circuit 19 and which are additionally charged with input voltages of input terminals 12 selected by input terminal selection circuit 13.

CPU 22 sends off a plurality of preset data to preset data storage registers 16. CPU 22 further carries out a predetermined process in accordance with A/D conversion results so that results of such a process are transmitted to external equipment 19, such as an alarm and a display device.

Next, the structure of A/D conversion circuit 14 will be described in detail below with reference to its block diagram of FIG. 2.

Figure 2:
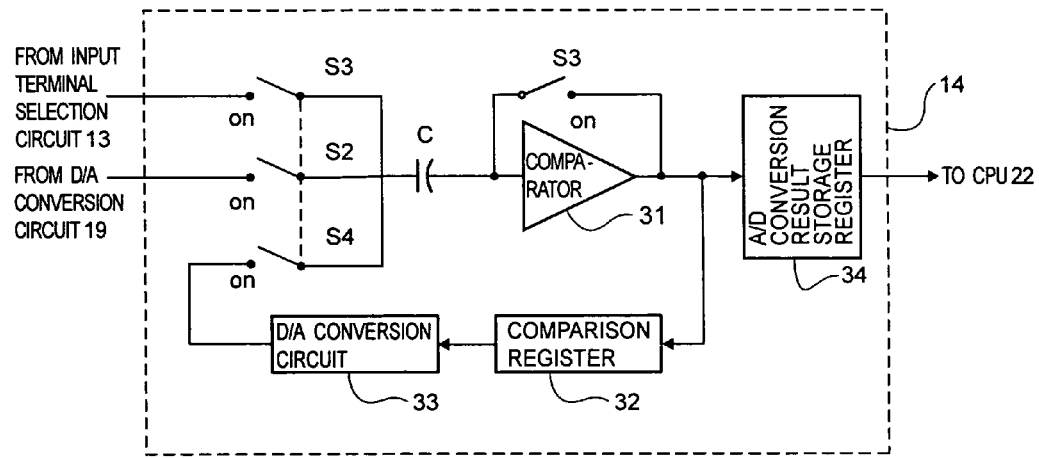
FIG. 2 is a block diagram of the structure of the A/D converter shown in FIG. 1.

As shown in FIG. 2, A/D conversions circuit 14 is provided with sampling capacitor C, comparator 31, comparison register 32, D/A conversion circuit 33 for comparison and conversion result storage register 34 to store A/D conversion results.

A/D conversion circuit 14 further includes auto-zero switch S1 to short input and output terminals of comparator 31, pre-charge switch S2 to connect sampling capacitor C to D/A conversion circuit 19, sampling switch S3 to connect sampling capacitor C to input terminal selection circuit 13 and comparator switch S4 to connect sampling capacitor C to D/A conversion circuit 33. Switches S1–S3 turn on or off separately.

Operations of micro-computer 10 and A/D converter 11 will be described below with reference to a flow chart of FIG. 3.

Figure 3:
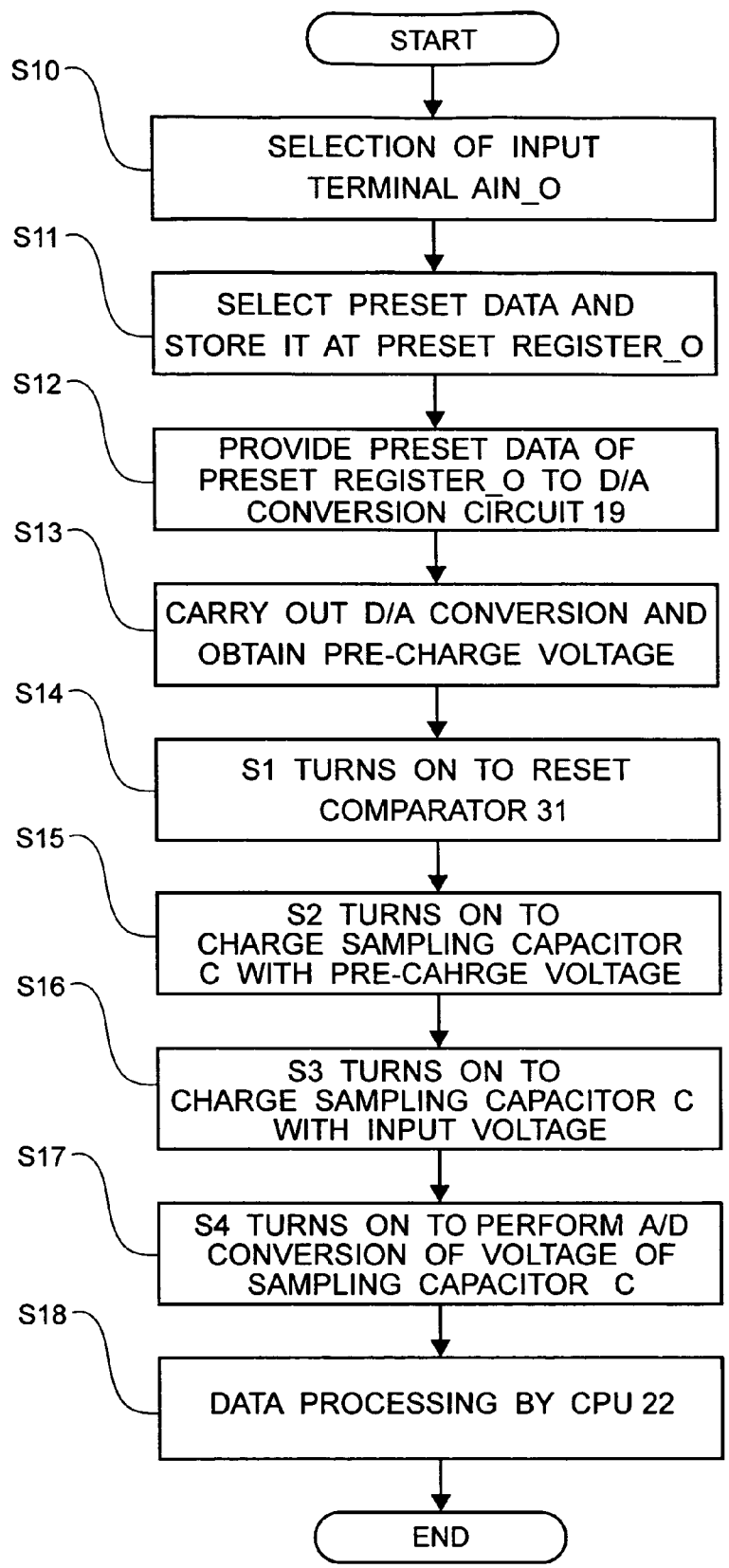
FIG. 3 is an operation flow chart of the A/D converter.

As shown in FIG. 3, when control circuit 20 sends input terminal selection circuit 13 an instruction to select an input terminal, input terminal selection circuit 13 selects input terminal AIN_0 (Step S10).

Next, preset data selection circuit 17 selects one of preset data from preset data register 16 in accordance with a kind of input voltages at input terminal AIN_0 synchronously with the instruction from control circuit 20 and stores it at preset register _0 (Step 11).

Preset register selection circuit 18 then selects preset register _0 synchronously with the instruction to select the input terminal and sends D/A conversion circuit 19 preset data stored at preset register _0 (Step S12).

Control circuit 20 supplies D/A conversion circuit 19 with a D/A conversion start instruction and D/A conversion circuit 19 converts digital preset values from preset register selection circuit 18 into analog signals so as to output pre-charge voltages (Step S13).

Control circuit 20 sends an A/D conversion start instruction to A/D conversion circuit 14, which, in turn, carries out an A/D conversion.

Initially, auto-zero switch S1 turns on to short-circuit input and output terminals of comparator 31. Thus, sampling capacitor C discharges residual voltages and the input and potentials at the output terminals of comparator 31 becomes equal to each other so that an operation point of comparator 31 is reset (Step S14).

Next, pre-charge switch S2 turns on for a pre-charge duration in a sampling period of the A/D conversion and a pre-charge voltage is charged at sampling capacitor C. Thus, sampling capacitor C can be pre-charged with such a voltage to be close to an input voltage regardless of the kind of the input voltage (Step 15).

Sampling switch S3 then turns on for a sampling duration and sampling capacitor C additionally charges an input voltage at an input terminal selected by input terminal selection circuit 13. Thus, even for a short sampling duration, sampling capacitor C can sufficiently charge a voltage up to an input voltage (Step 16).

Next, for a conversion duration, comparator switch S4 turns on so that comparator 31 compares the voltage charged at sampling capacitor C and an output voltage of D/A conversion circuit 33. In order to make a difference between those voltages as small as possible, comparison register 32 provides D/A conversion circuit 33 with a digital value.

When the output voltage of D/A conversion circuit 33 is coincident in magnitude with the voltage at sampling capacitor C, A/D conversion result storage register 34 stores the final digital value of comparison register 32 as an A/D conversion result (Step 17).

CPU 22 then reads in, and processes, the A/D conversion result (Step 18) and an A/D conversion operation for input terminal AIN_0 is finished.

Next, input terminal AIN_1 is selected and Steps 10–18 are repeated for it.

Detailed operations of A/D conversion circuit 14 will be described below with reference to timing charts shown in FIG. 4.

Figure 4:
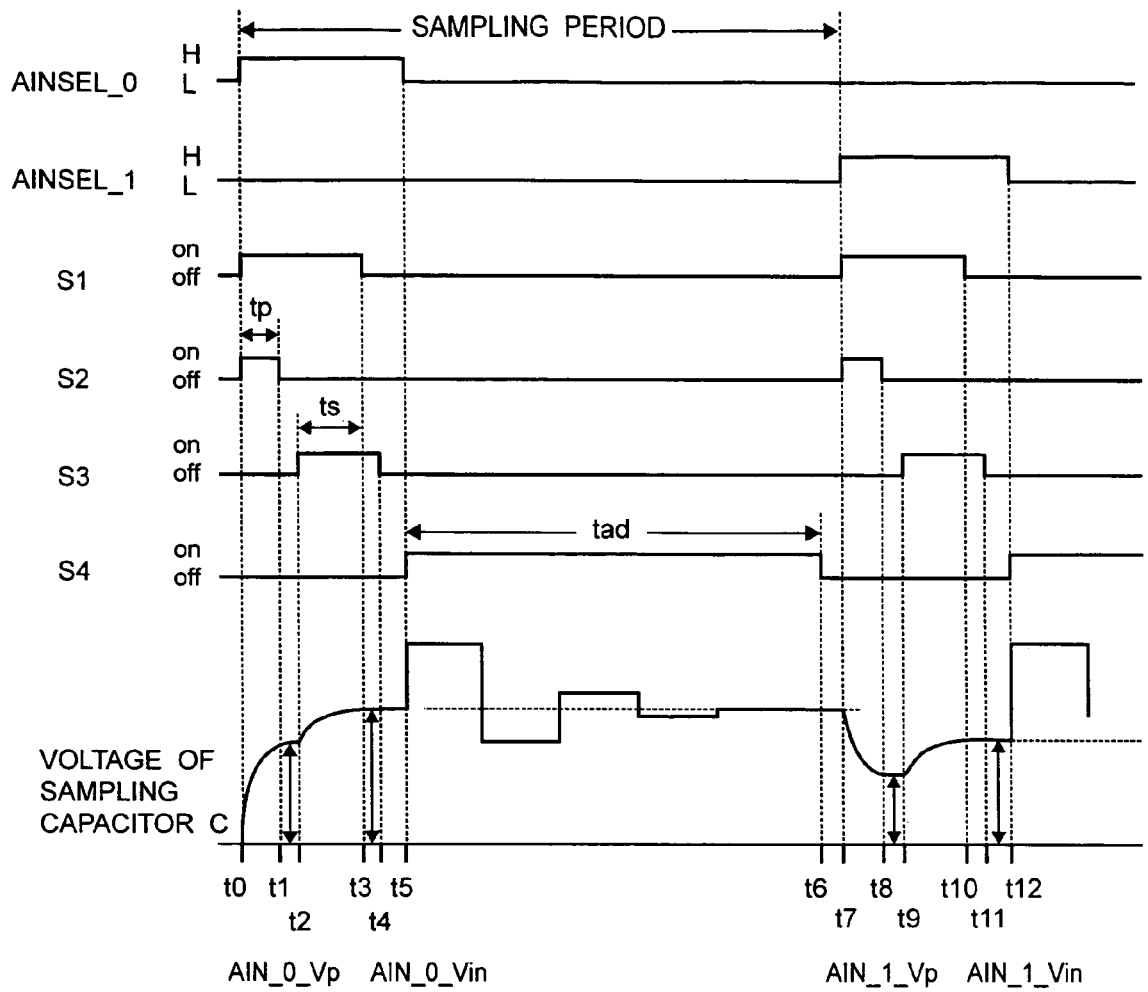
FIG. 4 is operation timing charts of the A/D converter.

When instruction signal AINSEL_0 becomes high (H) to select an input terminal at time t0 as shown in FIG. 4, the input and output terminals of comparator 31 are shorted to reset its operation points.

At the same time, pre-charge switch S2 turns on for pre-charge duration tp and sampling capacitor C charges pre-charge voltage AIN_0_Vp so that voltages of sampling capacitor C rise up.

Pre-charge switch S2 then turns off at time t1. Subsequently, sampling switch S3 turns on at time t2 and sampling capacitor C continues an additional charge with input voltage AIN_0_Vin for sampling period ts. As a result, the voltage of sampling capacitor C rises up and attains input voltage AIN_0_Vin within a short period of time.

Next, when auto-zero switch S1 turns off at time t3, sampling capacitor C stops charging and sampling period ts is terminated.

After a time lag, sampling switch S3 turns off at time t4 and instruction signal AINSEL_0 then becomes low (L) to release the selection of input terminals at time t5.

At the same time, comparator switch S4 turns on and A/D conversion circuit 14 starts the A/D conversion. When conversion period tad passes, comparator switch S4 turns off at time t6 and the A/D conversion is terminated.

Subsequently, when instruction signal AINSEL_1 becomes high (H) for the selection of input terminals at time t7, pre-charge voltage AIN_1_Vp is selected at input terminal AIN_1 and the A/D conversion is repeated.

Next, preset data will be described concretely below with reference to a preset data table shown in FIG. 5.

Figure 5:
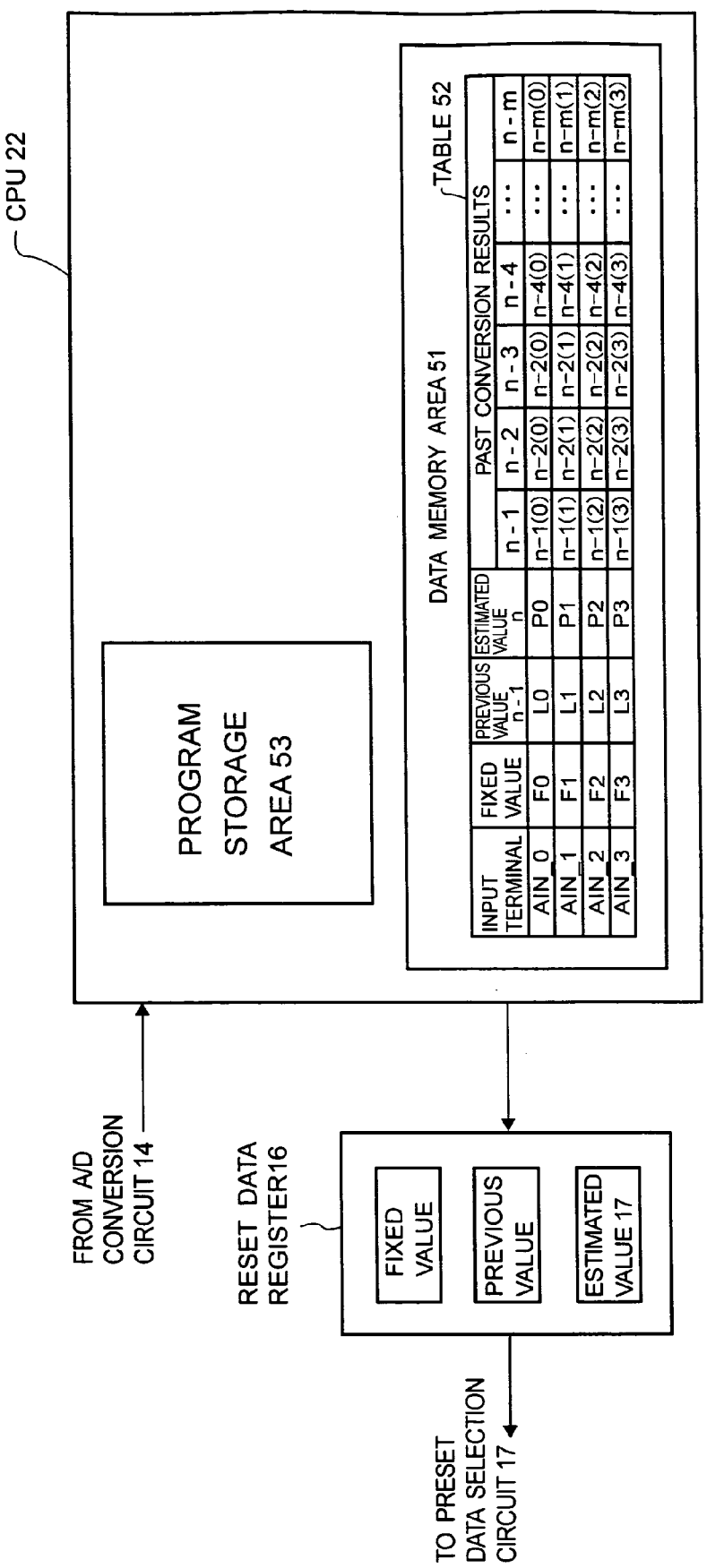
FIG. 5 is a block diagram of a pre-set data system of the A/D converter.

Data memory area 51 in CPU 22 stores the preset data table with respect to input terminals AIN_0-AIN_3 as shown in FIG. 5. Predetermined fixed values F0–F3, previous values L0–L3, estimated values P0–P3 and past conversion values at previous m times n-1, n-2, . . . , and n-m are prepared for input terminals AIN_0-AIN_3, respectively.

The fixed values are set to central values of input voltage variable widths in the case that the input voltages are, for instance, substantially fixed but have slight variation in width. The previous values are set to conversion results at previous time n-1 in the case that variable rates of input values, for instance, are not so large.

Further, the estimated values are determined from past conversion results in the case that input voltages, for instance, repeat changes in similar patterns. The estimated values are obtained from arithmetic estimate operations which let past conversion results pass through digital filters to obtain moving average values or the approximation of functions by means of a least square method. Such digital filters can be configured by specific hardware or software.

Writing and reading the preset data at preset data table 52 are controlled by programs stored at program storage area 53 provided in CPU 22.

As set forth above, since A/D converter 11 of the embodiment selects pre-charge voltages charged at sampling capacitor C in response to kinds of input voltages for respective input terminals, charge and discharge of sampling capacitor C can be sufficiently performed for a short period of time.

Thus, satisfactory A/D conversion accuracy is obtained for each input terminal. Current flowing backward to input terminals are suppressed so that damage to the circuits may be prevented.

Although two D/A conversion circuits are provided for pre-charge and comparison to carry out the A/D conversion in the embodiment, one D/A conversion circuit can be substituted for them.

Figure 6:
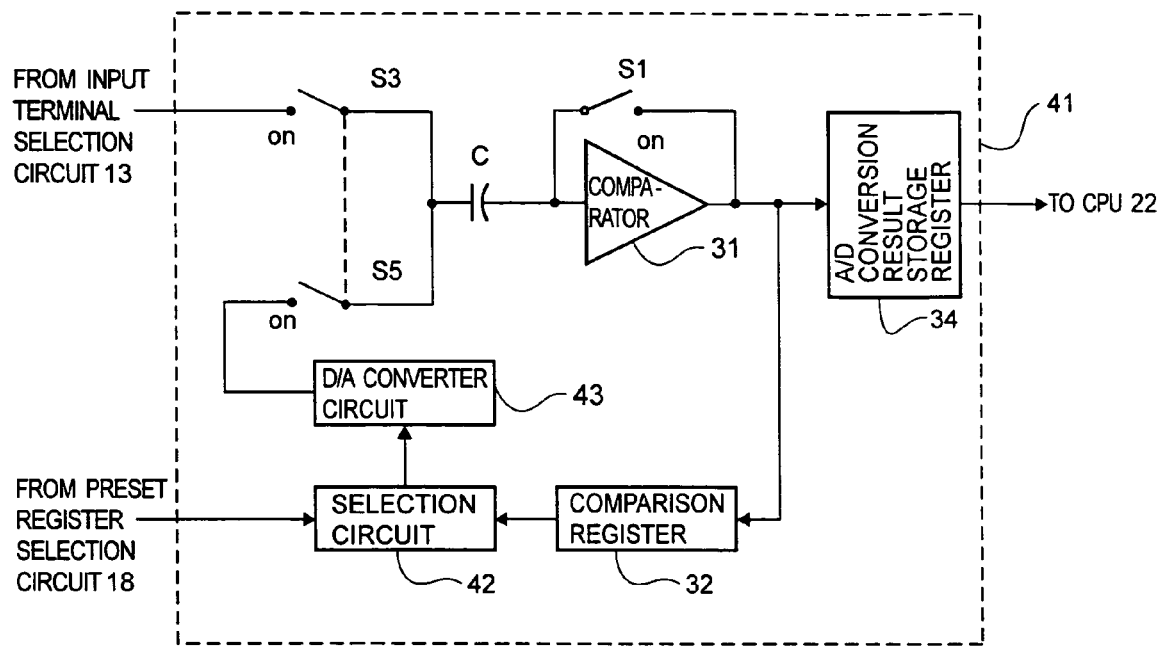
FIG. 6 is a block diagram of an A/D converter according to an embodiment of the present invention.
Figure 7:
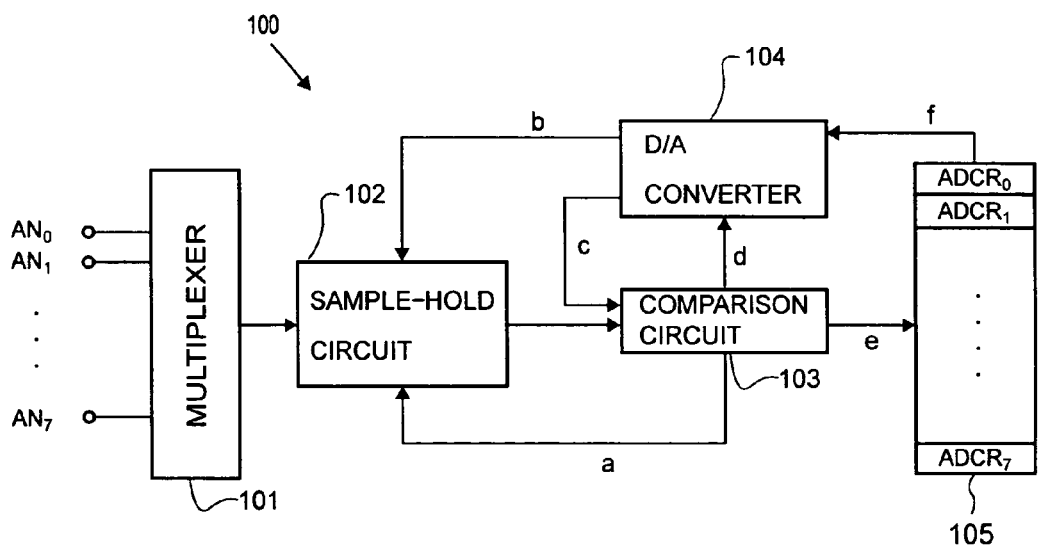
FIG. 7 is a block diagram of a conventional A/D converter.

The concrete structure of an A/D conversion circuit with such one D/A conversion circuit will be described below. FIG. 6 is a block diagram of A/D conversion circuit 41. A/D conversion circuit 41 includes one D/A conversion circuit 43 which alternatively switches D/A conversion operations from pre-charge to comparison. This differs from A/D conversion circuit 14.

As shown in FIG. 6, A/D conversion circuit 41 is provided with selection circuit 42 to select either an output of preset register selection circuit 18 or that of comparison register 32, D/A conversion circuit 43 to carry out a D/A conversion of an output of selection circuit 42, switch S5 to connect sampling capacitor C to D/A conversion circuit 43. Switch S3 and S5 turn on or off separately.

During the pre-charge period, selection circuit 42 selects the output of preset register 18 and D/A conversion circuit 43 outputs pre-charge voltages. Sampling capacitor C is charged with pre-charge voltages supplied through switch S5.

During the conversion period, selection circuit 42 selects the output of comparison register 32 so that D/A conversion circuit 43 outputs comparison voltages. Comparator 31 compares the comparison voltages supplied through switch S5 with those of sampling capacitor C.

Further detailed operations of A/D conversion circuit 41 are substantially the same as in the flow and timing charts shown in FIGS. 3 and 4, respectively, and their explanations are omitted accordingly. This embodiment has an advantage to make an A/D conversion circuit and a micro-computer provided with significantly compact.

The present invention is not limited to the embodiments described above. Although the invention has been described in its applied form with a certain degree of particularity, it is understood that the present disclosure of the preferred form can be changed in the details of construction and the combination and arrangement of components may be resorted to without departing from the spirit and the scope of the invention as hereinafter claimed. Some components of the embodiments may be eliminated or various components from different embodiments may also be combined.

YOUR REFERENCE ONLY

TERM LIST

- 10: micro-computer
- 11: A/D converter
- 12: analog input terminals
- 13: input terminal selection circuit
- 14: A/D conversion circuit
- 15: preset register
- 16: preset data storage register
- 17: preset data selection circuit
- 18: preset register selection circuit
- 19: D/A conversion circuit
- 20: control circuit
- 22: CPU
- 24: external equipment
- 25: output terminal
- 31: comparator
- 32: comparison register
- 33: D/A conversion circuit
- 34: A/D conversion storage register
- 41: A/D conversion circuit
- 42: selection circuit
- 43: D/A conversion circuit
- 51: data memory area
- 52: preset data table
- 53: program storage area
- 100: A/D converter
- 101: multiplexer
- 102: sample-hold circuit
- 103: comparison circuit
- 104: D/A converter
- 105: A/D conversion-result storage register
- C: sampling capacitor
- S1: auto-zero switch
- S2: pre-charge switch
- S3: sampling switch
- S4: comparator switch
- S5: switch

What is claimed is:

1. An analog-to-digital converter comprising:
   analog input terminals to which analog input signals are supplied;
   an input terminal selection circuit to select one of said analog input terminals;
   preset registers provided for said analog input terminals;
   preset data registers to store preset data;
   a preset data selection circuit to select and provide one of said preset data to said preset registers;
   a preset register selection circuit to select one of said preset registers which corresponds to the one of said analog input terminals selected by said input terminal selection circuit;
   a digital-to-analog conversion circuit to convert an output of said preset data registers into an analog voltage;
   a sampling capacitor; and
   an analog-to-digital conversion circuit which provides said sampling capacitor with an output of said digital-to-analog conversion circuit for a pre-charge duration of a sampling period and the input voltage at the one of said analog input terminals selected by said input terminal selection circuit for a sampling duration of said sampling period and which compares a voltage of said sampling capacitor with a predetermined reference voltage to convert the input voltage into digital data for a conversion duration, wherein said analog-to-digital converter selects said preset data in response to kinds of the input voltages applied for said input terminals.

2. An analog-to-digital converter according to claim 1, wherein said preset data are predetermined fixed values, previous analog-to-digital conversion results, and estimated values based on past analog-to-digital conversion results.

3. An analog-to-digital converter according to claim 2, wherein said estimated values are moving-average values of said past analog-to-digital conversion results.

4. A micro-computer system comprising:
   analog-to-digital converter according to claim 3;
   a central processing unit to process an output of said analog-to-digital converter; and
   an output terminal through which an output of said central processing unit are supplied.

5. A micro-computer system comprising:
   the analog-to-digital converter according to claim 2;
   a central processing unit to process an output of said analog-to-digital converter; and
   an output terminal through which an output of said central processing unit is supplied.

6. A micro-computer system comprising:
   the analog-to-digital converter according to claim 1;
   a central processing unit to process an output of said analog-to-digital converter; and
   an output terminal through which an output of said central processing unit is supplied.

* * * * *